(12) United States Patent
Cho et al.

(10) Patent No.: US 9,293,360 B2
(45) Date of Patent: Mar. 22, 2016

(54) MANUFACTURING METHOD OF SEMICONDUCTOR MEMORY DEVICE WITH AIR GAP ISOLATION LAYERS

(71) Applicant: SK hynix Inc., Icheon-si, Gyeonggi-do (KR)

(72) Inventors: Jung Il Cho, Icheon-si (KR); Jong Moo Choi, Cheongju-si (KR); Eun Joo Jung, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/307,670

(22) Filed: Jun. 18, 2014

(65) Prior Publication Data
US 2014/0295641 A1    Oct. 2, 2014

Related U.S. Application Data

(62) Division of application No. 13/780,927, filed on Feb. 28, 2013, now abandoned.

(30) Foreign Application Priority Data

Dec. 4, 2012    (KR) .................. 10-2012-0139757

(51) Int. Cl.
| | |
|---|---|
| *H01L 21/764* | (2006.01) |
| *H01L 21/762* | (2006.01) |
| *H01L 21/311* | (2006.01) |
| *H01L 29/788* | (2006.01) |
| *H01L 29/66* | (2006.01) |
| *H01L 21/28* | (2006.01) |
| *H01L 21/02* | (2006.01) |
| *H01L 27/115* | (2006.01) |
| *H01L 29/51* | (2006.01) |

(52) U.S. Cl.
CPC .......... *H01L 21/764* (2013.01); *H01L 21/022* (2013.01); *H01L 21/02203* (2013.01); *H01L 21/28202* (2013.01); *H01L 21/28273* (2013.01); *H01L 21/31116* (2013.01); *H01L 21/762* (2013.01); *H01L 27/11521* (2013.01); *H01L 29/66825* (2013.01); *H01L 29/7881* (2013.01); *H01L 29/518* (2013.01)

(58) Field of Classification Search
CPC ............ H01L 21/28273; H01L 21/76289; H01L 21/764; H01L 21/768; H01L 21/28202; H01L 27/11521; H01L 29/66825; H01L 29/518
See application file for complete search history.

(56) References Cited

U.S. PATENT DOCUMENTS

| | | | | |
|---|---|---|---|---|
| 2006/0281295 A1* | 12/2006 | Naujok | ............... | H01L 21/7682 438/618 |
| 2008/0085583 A1* | 4/2008 | Park | .................. | H01L 21/02181 438/261 |

(Continued)

*Primary Examiner* — Victor A Mandala
*Assistant Examiner* — Regan J Rundio
(74) *Attorney, Agent, or Firm* — William Park & Associates Ltd.

(57) ABSTRACT

A semiconductor memory device includes a semiconductor substrate in which an active region and an isolation region are defined, a tunnel insulating layer and a floating gate formed on the semiconductor substrate in the active region, a trench formed in the semiconductor substrate in the isolation region, a dielectric layer formed along a top surface and a portion of a side surface of the floating gate, wherein the dielectric layer extends higher than a surface of the semiconductor substrate in the isolation region and defines an air gap in the trench, and a control gate formed on the dielectric layer, wherein the dielectric layer includes the first nitride layer, a first oxide layer, a second nitride layer and a second oxide layer.

15 Claims, 8 Drawing Sheets

(56) References Cited

U.S. PATENT DOCUMENTS

| | | | |
|---|---|---|---|
| 2008/0179655 A1* | 7/2008 | Ishida et al. | 257/316 |
| 2008/0179715 A1* | 7/2008 | Coppa | H01L 21/02164 257/647 |
| 2012/0132982 A1* | 5/2012 | Lee | H01L 21/28273 257/321 |
| 2012/0178235 A1* | 7/2012 | Pachamuthu et al. | 438/421 |
| 2012/0184111 A1* | 7/2012 | Monden et al. | 438/776 |
| 2013/0059422 A1* | 3/2013 | Lee | H01L 21/764 438/268 |
| 2013/0248971 A1* | 9/2013 | Miyazaki et al. | 257/319 |
| 2013/0277730 A1* | 10/2013 | Jung et al. | 257/316 |
| 2014/0021524 A1* | 1/2014 | Sim et al. | 257/314 |
| 2014/0042516 A1* | 2/2014 | Kim et al. | 257/315 |
| 2014/0138761 A1* | 5/2014 | Yagishita et al. | 257/326 |
| 2014/0239368 A1* | 8/2014 | Sakaguchi et al. | 257/321 |
| 2014/0252434 A1* | 9/2014 | Lee et al. | 257/288 |

* cited by examiner

MANUFACTURING METHOD OF SEMICONDUCTOR MEMORY DEVICE WITH AIR GAP ISOLATION LAYERS

CROSS-REFERENCE TO RELATED APPLICATION

The present application claims priority to Korean patent application number 10-2012-0139757 filed on Dec. 4, 2012, in the Korean Intellectual Property Office, the entire disclosure of which is incorporated by reference herein.

BACKGROUND

1. Technical Field

Various embodiments relate generally to a semiconductor memory device and a method of manufacturing the same and, more particularly, to a semiconductor memory device including an air gap and a method of manufacturing the same.

2. Related Art

A semiconductor memory device includes a plurality of memory cells configured to store data and devices configured to perform various operations. High-density integration techniques have become increasingly important to achieve higher data capacity and reduced weight for a semiconductor memory device. In particular, since memory cells occupy a large space of the semiconductor chip, a reduction in size of the memory cells and a reduction in space between adjacent memory cells have become issues.

Among semiconductor memory devices, a NAND flash memory device includes memory cells arranged in units of strings. Isolation layers, formed of insulating materials, are filled between these strings, that is, at isolation regions. The isolation layers function to block electrical influence between adjacent strings and memory cells, e.g., interference therebetween.

However, with increasing integration degree of the semiconductor memory device, the isolation layers formed of the insulating materials may have limitations in blocking interference between the memory cells arranged in the strings and the memory cells, which may deteriorate the reliability of the semiconductor memory device.

BRIEF SUMMARY

Various embodiments relate to a semiconductor memory device, preventing interference between semiconductor memory devices, and a method of manufacturing the same.

A semiconductor memory device according to an embodiment of the present invention includes a semiconductor substrate in which an active region and an isolation region are defined, a tunnel insulating layer and a floating gate formed on the semiconductor substrate in the active region, a trench formed in the semiconductor substrate in the isolation region, a dielectric layer formed along a top surface and a portion of a side surface of the floating gate, wherein the dielectric layer extends higher than a surface of the semiconductor substrate in the isolation region and defines an air gap in the trench, and a control gate formed on the dielectric layer, wherein the dielectric layer includes the first nitride layer, a first oxide layer, a second nitride layer and a second oxide layer.

A method of manufacturing a semiconductor memory device according to an embodiment of the present invention includes forming a tunnel insulating layer and a first conductive layer configured as a floating gate in an active region of a semiconductor substrate, and forming a trench in an isolation region of the semiconductor substrate, filling the trench with a sacrificial layer having a top surface higher than a surface of the semiconductor substrate, forming a first oxide layer along an entire surface of a resultant structure filled with the sacrificial layer, forming an air gap in the isolation region by removing the sacrificial layer while maintaining the first oxide layer, transforming a portion of the first oxide layer into a first nitride layer, forming a second nitride layer and a second oxide layer over the first oxide layer, and forming a second conductive layer configured as a control gate on the second oxide layer.

DETAILED DESCRIPTION

Figure 1A:
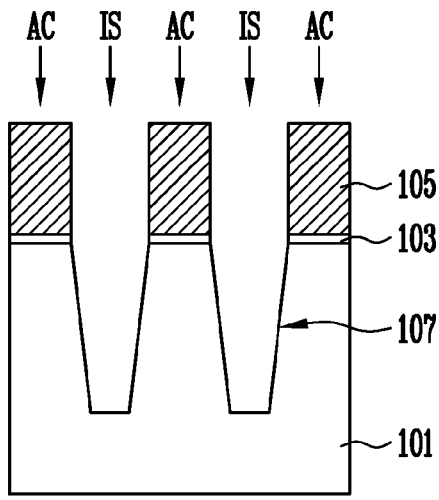
FIGS. 1A to 1H are cross-sectional views illustrating a method of manufacturing a semiconductor memory device according to an embodiment of the present invention.

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

FIGS. 1A to 1H are cross-sectional views illustrating a method of manufacturing a semiconductor memory device according to an embodiment of the present invention. Like reference designators in the drawings denote like or corresponding elements, and thus their description will be omitted to avoid duplicate explanation.

Referring to FIG. 1A, a tunnel insulating layer 103 and a first conductive layer 105 configured as a floating gate may be sequentially formed on a semiconductor substrate 101 wherein active regions AC and isolation regions IS are defined. The tunnel insulating layer 103 may include an oxide layer, and the first conductive layer 105 may include a polysilicon layer. For example, the first conductive layer 105 may include a doped polysilicon layer implanted with impurities, or a stacked layer of an undoped polysilicon layer implanted with no impurities and a doped polysilicon layer.

The first conductive layer 105, the tunnel insulating layer 103 and the semiconductor substrate 101 in the isolation regions IS may be etched to form trenches 107. For example, though not illustrated in FIG. 1A, a mask pattern (not illustrated) that opens the isolation regions IS may be formed over the first conductive layer 105, and the first conductive layer 105, the tunnel insulating layer 103 and the semiconductor substrate 101 exposed through the mask pattern (not illustrated) may be sequentially etched to form the trenches 107. The mask pattern (not illustrated) may be removed after the trenches 107 are formed.

Figure 1B:
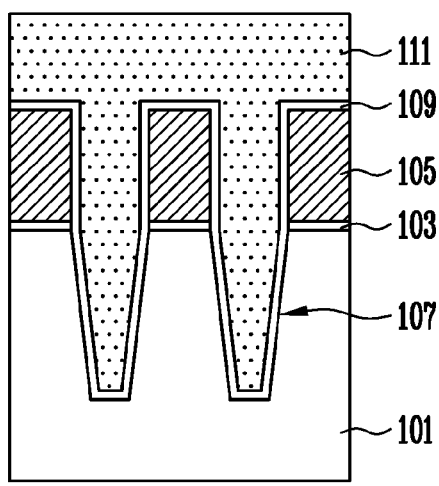

Referring to FIG. 1B, a liner insulating layer 109 may be formed along a surface of the entire structure including the trenches 107. The liner insulating layer 109 may compensate for etch damage to surfaces of the trenches 107 during an etch process for forming the trenches 107. Subsequently, a sacrificial layer 111 may be formed over the entire structure including the liner insulating layer 109. The sacrificial layer 111 may include a flowable material for forming an air gap during subsequent processes. More specifically, the sacrificial layer 111 may include a carbon-based material (containing more than about 60% carbon). The carbon-based material may be easily removed by plasma. The carbon-based material for the sacrificial layer 111 may include a Spin On Carbon (SOC) layer, a photoresist (PR) layer, or a carbon layer for a hard mask. The sacrificial layer 111 having flowability may be formed by using a spin coating method.

Figure 1C:
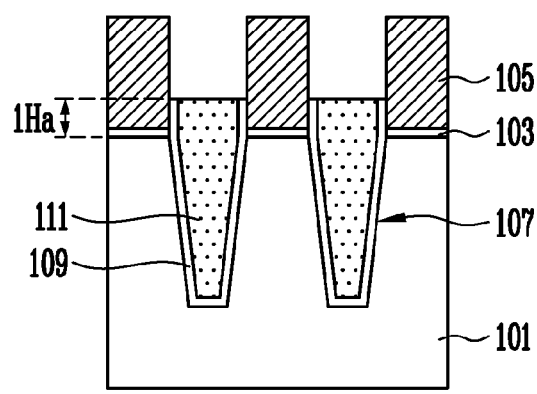

Referring to FIG. 1C, the first conductive layer 105 may be exposed by performing an etch process, and an upper height of an air gap to be formed during subsequent processes may be controlled by performing another etch process. More specifically, the sacrificial layer 111 and the liner insulating layer 109 may be etched by performing an etch-back process to expose the first conductive layer 105. After the first conductive layer 105 is exposed, another etch process may be further formed so that a top surface of the sacrificial layer 111 may be lower than a top surface of the first conductive layer 105. Here, it may be very important to control a height 1Ha between the top surface of the sacrificial layer 111 and a top surface of the semiconductor substrate 101. Interference between neighboring memory cells and strings may vary depending on the shape, width and height of an air gap to be formed during subsequent processes. Among them, the height of the air gap may be determined according to a height of the top surface of the sacrificial layer 111.

Figure 1D:
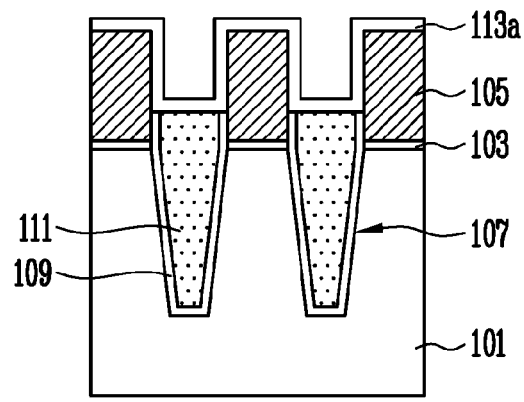

Referring to FIG. 1D, after the height of the sacrificial layer 111 is controlled, a first oxide layer 113a configured as a capping layer may be formed along a surface of the entire structure. The first oxide layer 113a may include an ultra low temperature oxide layer. An ultra low temperature oxide layer is an oxide layer formed at low temperature in order to prevent the sacrificial layer 111 from being damaged. The ultra low temperature oxide layer may be formed at a temperature ranging from approximately 50° C. to 100° C. since the sacrificial layer 111 including the carbon-based material may be damaged at a temperature ranging from approximately 300° C. to 400° C. In addition, the ultra low temperature oxide layer is non-porous. For example, the ultra low temperature oxide layer may include an $SiO_2$ layer. When the first oxide layer 113a is formed using atomic layer deposition (ALD), the first oxide layer 113a may have a uniform thickness as well as good step coverage. The thickness of the first oxide layer 113a may be controlled according to a memory device. For example, the first oxide layer 113a may have a thickness ranging from approximately 5 Å to 400 Å.

Figure 1E:
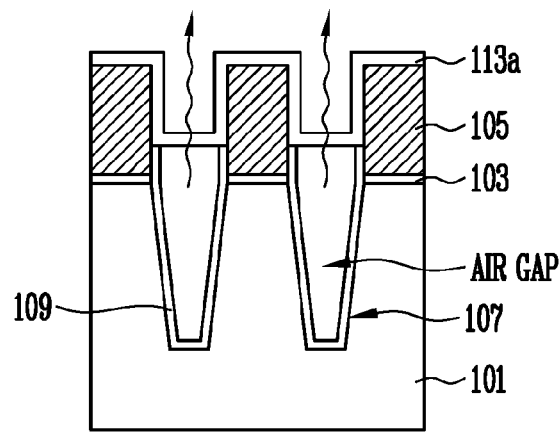

Referring to FIG. 1E, the sacrificial layer 111 (see FIG. 1D) under the first oxide layer 113a may be removed by using plasma. More specifically, plasma may be generated in a chamber into which the semiconductor substrate 101 is loaded. For example, oxygen, nitrogen or hydrogen plasma may be generated. A description will be made in reference to a case in which oxygen plasma is generated.

Figure 3:
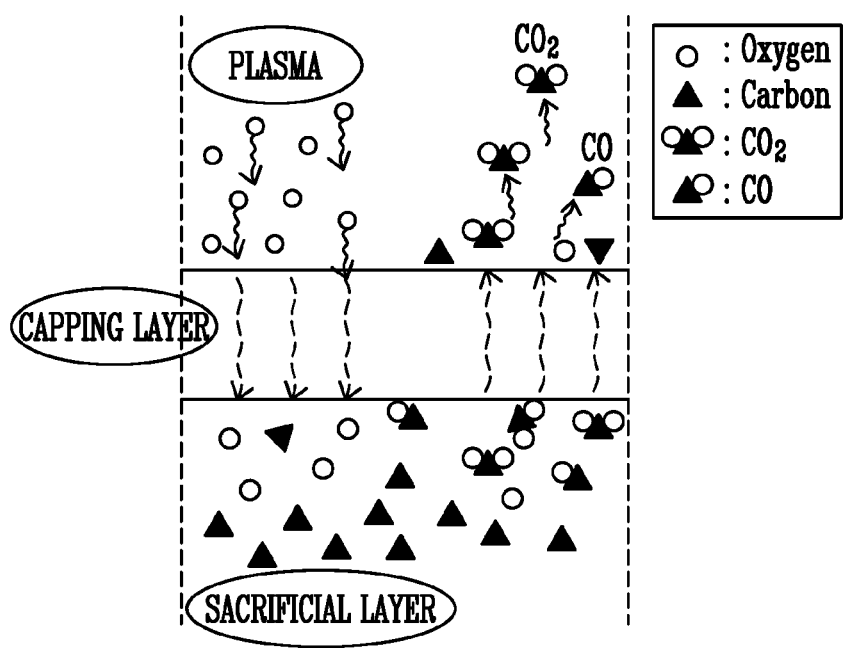
FIG. 3 is a view illustrating a principle of removing a sacrificial layer.

FIG. 3 is a view illustrating a principle of removing a sacrificial layer according to an embodiment of the present invention.

Referring to FIG. 3, when oxygen plasma is generated, oxygen radicals may be generated. These oxygen radicals may pass through the first oxide layer 113a (see FIGS. 1E and 1D) and reach the sacrificial layer 111. The oxygen radicals may react with carbon in the sacrificial layer 111 so that the sacrificial layer 111 may be changed into $CO_2$ or CO radicals. The $CO_2$ or CO radicals may escape to the outside through the first oxide layer 113a. In this manner, the sacrificial layer 111 under the first oxide layer 113a may be removed, and a space from which the sacrificial layer 111 is removed may be an air gap. Since the air gap has the same height as the sacrificial layer 111, the height 1Ha between the top surface of the air gap and the top surface of the semiconductor substrate 101 may be determined by controlling the height of the sacrificial layer 111 as illustrated in FIG. 1C.

Figure 1F:
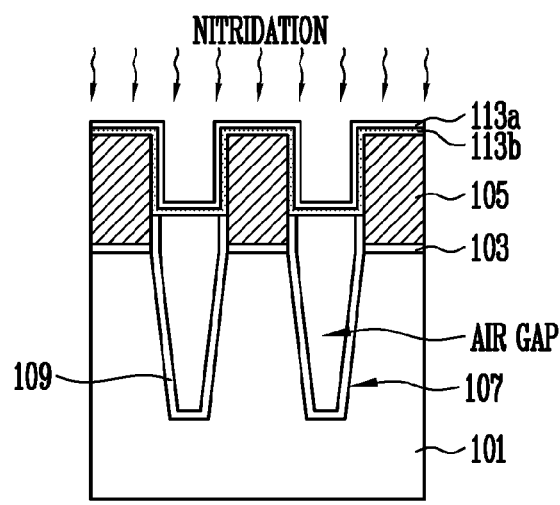

Referring to FIG. 1F, in order to prevent impurities (e.g., boron, phosphine and carbon), with which the first conductive layer 105 is doped, during subsequent processes, a lower portion of the first oxide layer 113a formed in the active regions AC and the isolation regions IS (see FIG. 1A) may be transformed into a first nitride layer 113b. The first nitride layer 113b may be formed by plasma nitridation or annealing. When plasma nitridation or annealing is performed under a nitrogen atmosphere at a temperature ranging from approximately 200° C. to 700° C., nitrogen may be diffused into the first oxide layer 113a so that a lower portion of the first oxide layer 113a may be transformed into an SiON layer. The SiON layer is defined as the first nitride layer 113b. After the first nitride layer 113b is formed by performing plasma nitridation, a stabilizing process may be further performed to improve the quality of the first nitride layer 113b. The stabilizing process may be performed by using plasma process under an oxygen atmosphere.

A method of forming the first nitride layer 113b by performing annealing is described below.

Since annealing may be performed at a higher temperature range (e.g., between about 600° C. to about 1100° C.) than the above-described plasma nitridation, an SiON layer formed by performing annealing may be more stabilized than a SiON layer formed by performing plasma nitridation. Therefore, after the first nitride layer 113b is formed by performing annealing at high temperature, additional nitridation for improving layer quality may not be performed. The thermal treatment process may be performed under an $N_2$, NO or $N_2O$ atmosphere.

Figure 1G:
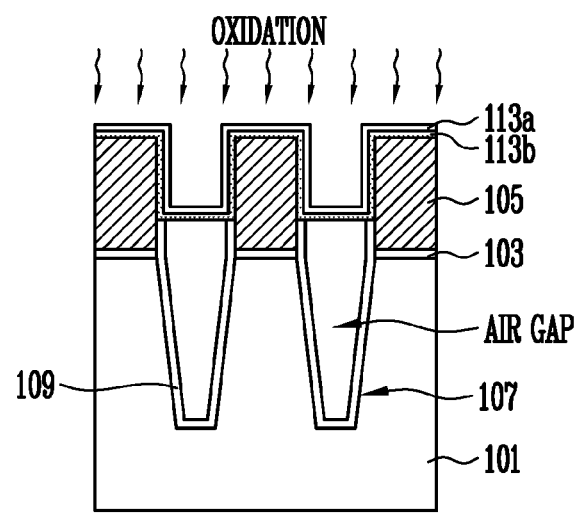

Referring to FIG. 1G, after the first nitride layer 113b is formed, additional oxidation may be performed to improve the quality of the first oxide layer 113a. The additional oxidation may be performed by using $O_2$ dry oxidation or $O_2$ wet annealing.

Figure 1H:
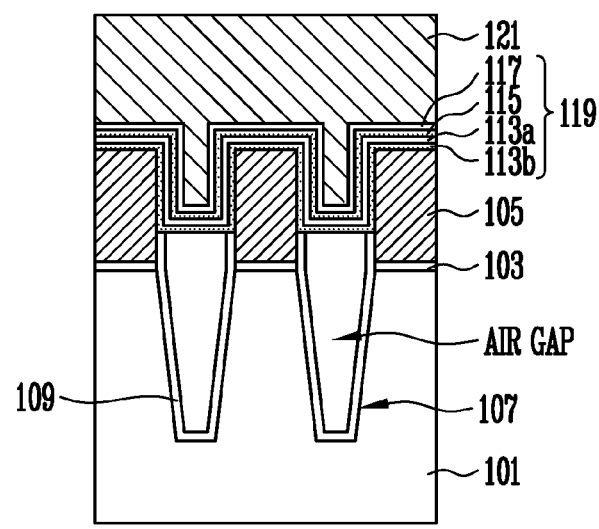

Referring to FIG. 1H, a second nitride layer 115 configured as a dielectric layer and a second oxide layer 117 may be formed over a surface of the entire structure. Therefore, a dielectric layer 119 may be formed such that the dielectric layer 119 includes the first nitride layer 113b, the first oxide layer 113a, the second nitride layer 115 and the second oxide layer 117. In other words, the dielectric layer 119 may have an N—O—N—O structure in the active regions AC and the isolation regions IS.

Subsequently, a second conductive layer 121 configured as a control gate may be formed on the dielectric layer 119. The second conductive layer 121 may include a polysilicon layer, and more specifically, a doped polysilicon layer.

As described above, an air gap may be formed at a desired location by using the first oxide layer 113a and the sacrificial layer 111. In addition, the manufacturing time may be reduced by using the first oxide layer 113a, remaining after the air gap is formed, as a dielectric layer. In particular, by forming the stably coupled first nitride layer 113b, generation of leakage current may be prevented, and parasitic capacitance may be reduced. As a result, disturbance of a semiconductor memory device may be reduced, and a decrease in program speed may be prevented.

FIGS. 2A to 2K are cross-sectional views illustrating a method of manufacturing a semiconductor memory device according to another embodiment of the present invention.

Like reference designators in the drawings denote like or corresponding elements, and thus their description will be omitted to avoid duplicate explanation.

Figure 2A:
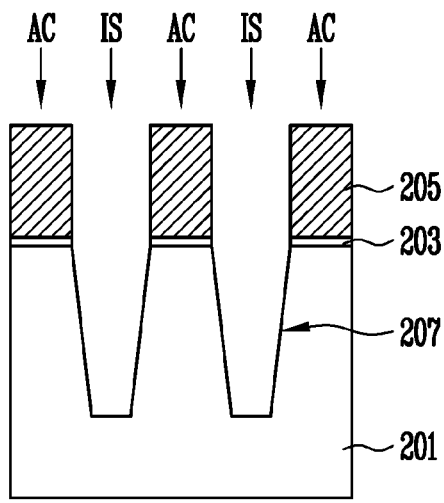
FIGS. 2A to 2K are cross-sectional views illustrating a method of manufacturing a semiconductor memory device according to an embodiment of the present invention.

Referring to FIG. 2A, a tunnel insulating layer 203 and a first conductive layer 205 configured as a floating gate may be sequentially formed on a semiconductor substrate 201 where active regions and isolation regions are defined. The tunnel insulating layer 203 may include an oxide layer, and the first conductive layer 205 may include a polysilicon layer. For example, the first conductive layer 205 may include a doped polysilicon layer implanted with impurities, or a stacked layer of an undoped polysilicon layer implanted with no impurities and a doped polysilicon layer.

The first conductive layer 205, the tunnel insulating layer 203 and the semiconductor substrate 201, which are formed in the isolation regions IS, may be etched to form trenches 207. For example, though not illustrated in FIG. 2A, a mask pattern (not illustrated) that opens the isolation regions IS may be formed over the first conductive layer 105, the first conductive layer 205, the tunnel insulating layer 203 and the semiconductor substrate 201 exposed through the mask pattern (not illustrated) may be sequentially etched to form the trenches 207. The mask pattern (not illustrated) may be removed after the trenches 207 are formed.

Figure 2B:
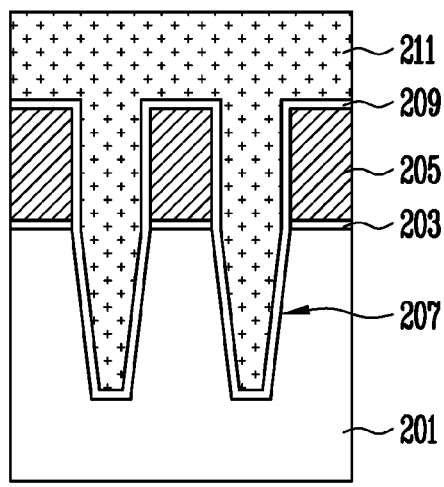

Referring to FIG. 2B, a liner insulating layer 209 may be formed along a surface of the entire structure including the trenches 207. The liner insulating layer 209 may recover damage to surfaces of the trenches 207 during an etch process for forming the trenches 207. Subsequently, a lower insulating layer 211 may be formed over the entire structure including the liner insulating layer 209. The lower insulating layer 211 may include an oxide layer. For example, the lower insulating layer 211 may include a polysilazane (PSZ) layer, which is a flowable material, so as to fill the trenches 207 with the PSZ layer. After the PSZ layer is formed, annealing may be performed to solidify the PSZ layer.

Figure 2C:
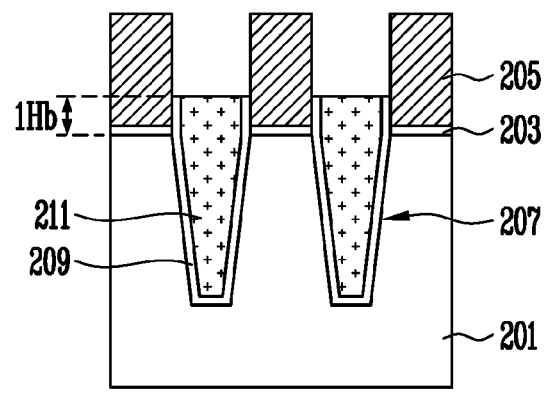

Referring to FIG. 2C, the first conductive layer 205 may be exposed by performing an etch process, and an upper height of an air gap to be formed during subsequent processes may be controlled by performing an additional etch process. Specifically, the lower insulating layer 211 and the liner insulating layer 209 may be etched by using an etch-back process to expose the first conductive layer 205. After the first conductive layer 205 is exposed, an additional etch process may be performed so that a top surface of the lower insulating layer 211 may be lower than a top surface of the first conductive layer 205. The etch process may be performed in such a manner that the lower insulating layer 211 and the liner insulating layer 209 include substantially the same or similar etch selectivity with respect to each other. Here, it may be very important to control a height 1Hb between the top surface of the lower insulating layer 211 and a top surface of the semiconductor substrate 201. Interference between neighboring memory cells and strings may vary depending on the shape, width and height of an air gap to be formed during subsequent processes. Among them, the height of the air gap may be determined by a height at which the top surface of the lower insulating layer 211 is.

Figure 2D:
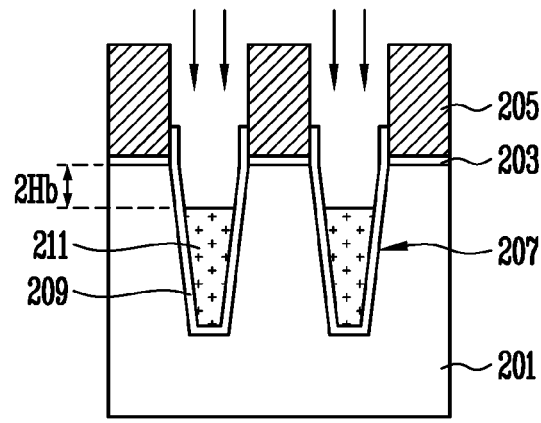

Referring to FIG. 2D, in order to control a height at which a bottom surface of an air gap to be formed is, the lower insulating layer 211 may be partially etched. In other words, an etch process may be performed to control a height 2Hb between a top surface of the semiconductor substrate 201 and a top surface of the lower insulating layer 211. Here, the etch process may be performed in such a manner that the liner insulating layer 209 has the same etch selectivity as the lower insulating layer 211 or the lower insulating layer 211 has a higher etch selectivity than the liner insulating layer 209.

Figure 2E:
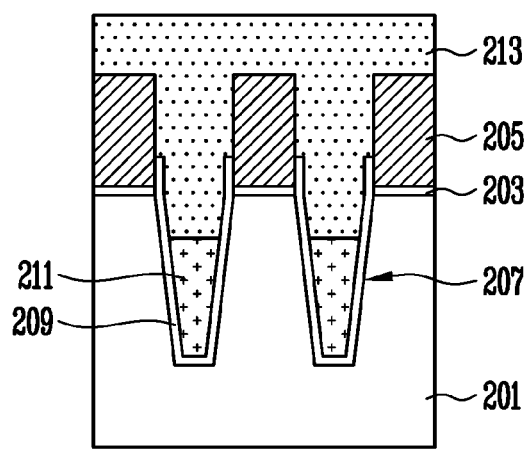

Referring to FIG. 2E, a sacrificial layer 213 may be formed over the entire structure. The sacrificial layer 213 may include a flowable material used to form an air gap during subsequent processes. More specifically, the sacrificial layer 213 may include a carbon-based material (containing more than about 60% carbon). The carbon-based material may be easily removed by plasma. For example, the carbon-based material for the sacrificial layer 213 may include a Spin On Carbon (SOC) layer, a photoresist (PR) layer or a carbon layer for a hard mask. The sacrificial layer 111 having flowability may be formed by a spin coating method.

Figure 2F:
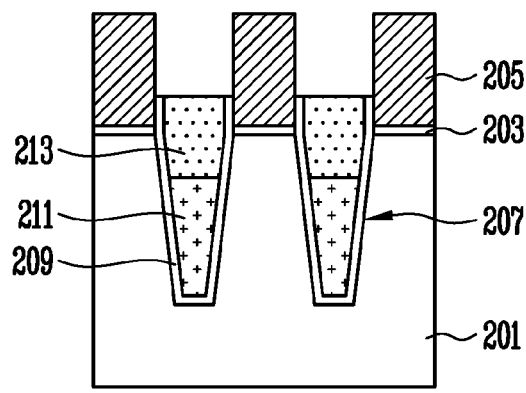

Referring to FIG. 2F, an etch process may be performed to expose the first conductive layer 205, and an upper height of an air gap to be formed during subsequent processes may be controlled by performing an additional etch process. More specifically, the sacrificial layer 213 and the liner insulating layer 209 may be etched by an etch-back process to expose the first conductive layer 205. After the first conductive layer 205 is exposed, an additional etch process may be performed so that a top surface of the sacrificial layer 213 may be lower than a top surface of the first conductive layer 205. The top surface of the sacrificial layer 213 may be at the same height as the top surface of the liner insulating layer 209. Alternatively, as illustrated in FIG. 2C, a height between the top surface of the semiconductor substrate 201 and the top surface of the sacrificial layer 213 may be controlled so as to be the above-described height 1Hb.

Figure 2G:
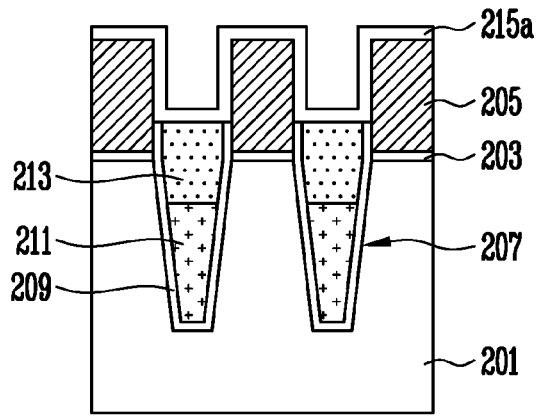

Referring to FIG. 2G, after the height of the sacrificial layer 213 is controlled, a first oxide layer 215a may be formed along a surface of the entire structure. The first oxide layer 215a may include an ultra low temperature oxide layer. The ultra low temperature oxide layer may be an oxide layer that is formed at low temperature in order to prevent the sacrificial layer 213 from being damaged. The ultra low temperature oxide layer may be formed at a temperature ranging from approximately 50° C. to 100° C. since the sacrificial layer 213 including the carbon-based material may be damaged at a temperature ranging from approximately 300° C. to 400° C. In other words, in order to prevent the sacrificial layer 213 from being damaged, the first oxide layer 215a may include an ultra low temperature oxide layer. In addition, the ultra low temperature oxide layer is non-porous. For example, the ultra low temperature oxide layer may include an SiO2 layer. When the first oxide layer 215a is formed using atomic layer deposition (ALD), the first oxide layer 215a may have uniform thickness as well as well as good step coverage. The thickness of the first oxide layer 215a may be controlled according to a memory device. For example, the first oxide layer 215a may have a thickness ranging from about 5 Å to about 400 Å.

Figure 2H:
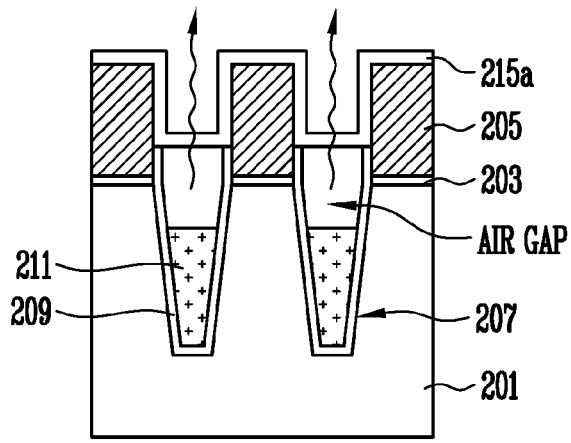

Referring to FIG. 2H, the sacrificial layer 213 (see FIG. 2G) under the first oxide layer 215a may be removed using plasma. More specifically, plasma may be generated in a chamber into which the semiconductor substrate 201 is loaded. For example, oxygen, nitrogen or hydrogen plasma may be generated. A description will be made in reference to a case in which oxygen plasma is generated.

FIG. 3 is a view illustrating a principle of removing a sacrificial layer according to an embodiment of the present invention.

Referring to FIG. 3, when oxygen plasma is generated, oxygen radicals may be generated. These oxygen radicals may pass through the first oxide layer 215a and reach the sacrificial layer 213. Then, the oxygen radicals and carbon in the sacrificial layer 213 may react with each other to change the sacrificial layer 213 into $CO_2$ or CO radicals. These $CO_2$ or CO radicals may escape to the outside through the first oxide layer 215a. In this manner, the sacrificial layer 213 under the first oxide layer 215a may be removed, and a space from which the sacrificial layer 213 is removed may be an air gap. Since the air gap has the same height as the sacrificial layer 213, the height between a top surface of the air gap and the top surface of the semiconductor substrate 201 may be determined by controlling the height of the sacrificial layer 213 as illustrated in FIG. 2F.

Figure 2I:
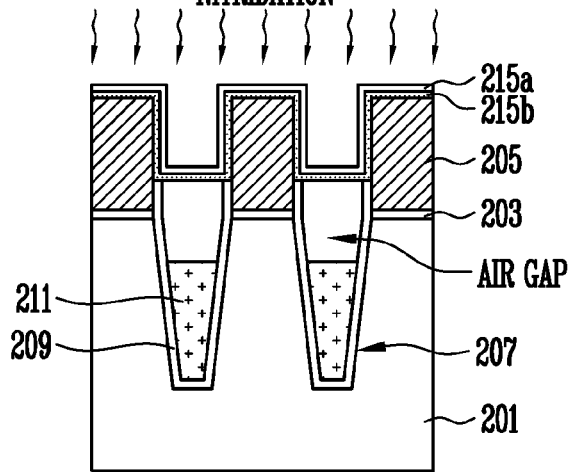

Referring to FIG. 2I, a lower portion of the first oxide layer 215a formed in the active regions AC and the isolation region IS may be changed into a first nitride layer 215b in order to prevent impurities (e.g., boron, phosphine and carbon), with which the first conductive layer 205 is doped, during subsequent processes. The first nitride layer 215b may be formed by performing plasma nitridation or annealing. When plasma nitridation or annealing is performed under a nitrogen atmosphere at a temperature ranging from approximately 200° C. to 700° C., nitrogen may be diffused into the first oxide layer 215a, and a lower portion of the first oxide layer 215a may be changed into an SiON layer. This SiON layer is defined as the first nitride layer 215b. After the first nitride layer 215b is formed by performing plasma nitridation, a stabilizing process may be further performed in order to improve the quality of the first nitride layer 215b. The stabilizing process may be performed by using a plasma process under an oxygen atmosphere.

A method of forming the first nitride layer 215b by performing annealing is described below.

Since annealing may be performed at a higher temperature range (e.g. between about 600° C. and about 1100° C.) than the above-described plasma nitridation, an SiON layer formed by annealing may be more stabilized than an SiON layer formed by plasma nitridation. Therefore, additional nitridation may not be performed to improve layer quality after the first nitride layer 215b is formed by performing annealing at high temperature. Annealing may also be performed under an $N_2$, NO or $N_2O$ atmosphere.

Figure 2J:
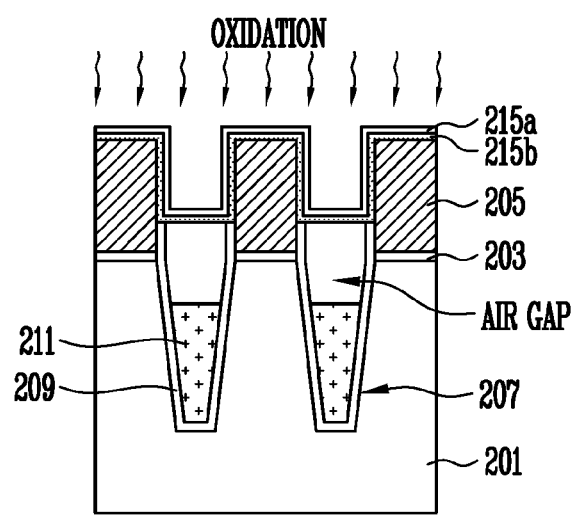

Referring to FIG. 2J, after the first nitride layer 215b is formed, oxidation may be further performed in order to improve the quality of the first oxide layer 215a. Oxidation may be additionally performed to improve layer quality. The additional oxidation may be performed by $O_2$ dry oxidation or $O_2$ wet annealing.

Figure 2K:
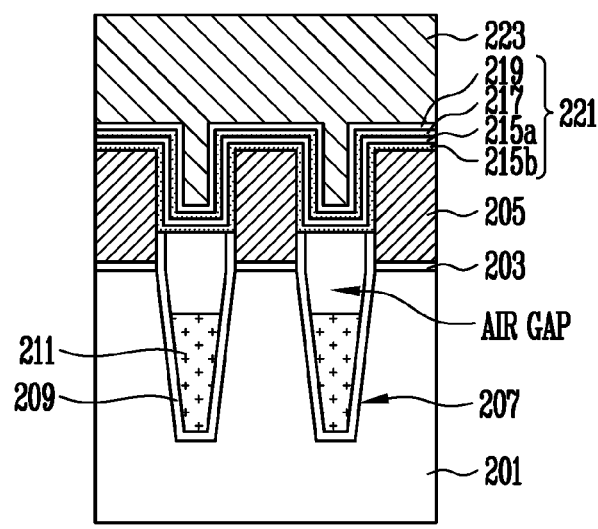

Referring to FIG. 2K, a second nitride layer 217 configured as a dielectric layer and a second oxide layer 219 may be formed along a surface of the entire structure. As a result, a dielectric layer 221 may be formed in which the dielectric layer 221 includes the first nitride layer 215b, a first oxide layer 215a, the second nitride layer 217 and the second oxide layer 219. In other words, the dielectric layer 221 may have an N—O—N—O structure in the active regions AC and the isolation regions IS.

Subsequently, a second conductive layer 223 configured as a control gate may be formed on the dielectric layer 221. The second conductive layer 223 may include a polysilicon layer, and more specifically, a doped polysilicon layer.

As described above, an air gap may be formed at a desired location by using the first oxide layer 215a and the sacrificial layer 213. In addition, since the first oxide layer 215a remaining after an air gap is formed is used as a dielectric layer, the manufacturing time may be reduced. In particular, by forming the stably coupled first nitride layer 215b, generation of leakage current may be prevented, and parasitic capacitance may be reduced. As a result, disturbance of a semiconductor memory device may be reduced, and a decrease in program speed may be prevented.

According to an embodiment of the present invention, by forming an air gap between tunnel insulating layers, interference between semiconductor memory devices may be prevented.

In addition, since a sacrificial layer and a capping layer are used when an air gap is formed, an air gap may be formed in a desired shape at a desired location.

In addition, since a capping layer for forming an air gap is used as a dielectric layer, an air gap may be easily formed, and parasitic capacitance in an isolation region may be reduced, so that disturbance may be reduced, and a decrease in program speed may be prevented.

What is claimed is:

1. A method of manufacturing a semiconductor memory device, the method comprising:
    forming a tunnel insulating layer and a first conductive layer configured as a floating gate in an active region of a semiconductor substrate, and forming a trench in an isolation region of the semiconductor substrate;
    filling the trench with a sacrificial layer having a top surface higher than a surface of the semiconductor substrate;
    forming a first oxide layer along an entire surface of a resultant structure filled with the sacrificial layer;
    forming an air gap in the isolation region by generating plasma and removing the sacrificial layer while maintaining the first oxide layer, wherein the sacrificial layer passes through the first oxide layer;
    transforming a portion of the first oxide layer into a first nitride layer;
    forming a second nitride layer and a second oxide layer over the first oxide layer; and
    forming a second conductive layer configured as a control gate on the second oxide layer.

2. The method of claim 1, wherein the first oxide layer includes an ultra low temperature oxide layer.

3. The method of claim 2, wherein the ultra low temperature oxide layer is formed using atomic layer deposition (ALD).

4. The method of claim 2, wherein the ultra low temperature oxide layer is formed at a temperature ranging from approximately 50° C. to 100° C.

5. The method of claim 1, wherein the first nitride layer is formed by transforming a lower portion of the first oxide layer into an SiON layer.

6. The method of claim 1, wherein the first nitride layer is formed by performing plasma nitridation or annealing.

7. The method of claim 6, wherein the plasma nitridation is performed under a nitrogen atmosphere at a temperature ranging from approximately 200° C. to 700° C.

8. The method of claim 6, further comprising performing a stabilized process to improve quality of the first nitride layer after the first nitride layer is formed by performing the plasma nitridation.

9. The method of claim 8, wherein the stabilizing process is performed by a plasma process under an oxygen atmosphere.

10. The method of claim 6, wherein the annealing is performed at a temperature ranging from 600° C. to 1100° C.

11. The method of claim 6, wherein the annealing is performed under an NO, $N_2$ or $N_2O$ atmosphere.

12. The method of claim 1, further comprising performing oxidation to improve quality of the first oxide layer after the transforming of the portion of the first oxide layer into the first nitride layer.

13. The method of claim 12, wherein $O_2$ dry oxidation or $O_2$ wet annealing is performed as the oxidation.

14. The method of claim 1, further comprising forming a lower insulating layer in a lower part of the trench before the filling of the sacrificial layer.

15. The method of claim 1, wherein the plasma includes oxygen plasma, nitrogen plasma or hydrogen plasma.

* * * * *